(12) United States Patent
Morelle et al.

(10) Patent No.: US 8,742,259 B2
(45) Date of Patent: Jun. 3, 2014

(54) HOLDER FOR ELECTRICAL COMPONENT AND ELECTRICAL DEVICE INCLUDING THE HOLDER AND COMPONENT

(75) Inventors: Jean-Michel Morelle, Beaugency (FR); Laurent Vivet, Bois d'Arcy (FR); Blaise Rouleau, Paris (FR)

(73) Assignee: Valeo Etudes Electroniques, Creteil (FR)

( * ) Notice: Subject to any disclaimer, the term of this patent is extended or adjusted under 35 U.S.C. 154(b) by 516 days.

(21) Appl. No.: 12/308,363

(22) PCT Filed: Jun. 12, 2007

(86) PCT No.: PCT/FR2007/051429
§ 371 (c)(1),
(2), (4) Date: Jul. 27, 2009

(87) PCT Pub. No.: WO2007/144539
PCT Pub. Date: Dec. 21, 2007

(65) Prior Publication Data
US 2010/0157561 A1 Jun. 24, 2010

(30) Foreign Application Priority Data
Jun. 13, 2006 (FR) ...................................... 06 52117

(51) Int. Cl.
*H05K 1/00* (2006.01)
(52) U.S. Cl.
USPC ............................ 174/252; 361/807; 361/720
(58) Field of Classification Search
CPC ................................................... H05K 1/0204
USPC .................. 361/807, 720; 257/796, 720, 717; 174/252
See application file for complete search history.

(56) References Cited

U.S. PATENT DOCUMENTS

| 4,339,768 | A | | 7/1982 | Keller et al. |
| 5,287,247 | A | * | 2/1994 | Smits et al. ................... 361/707 |
| 5,825,625 | A | * | 10/1998 | Esterberg et al. ............. 361/719 |
| 5,892,417 | A | * | 4/1999 | Johnson et al. ............... 333/193 |
| 6,076,737 | A | * | 6/2000 | Gogami et al. ............... 235/492 |
| 6,232,558 | B1 | * | 5/2001 | Tsukada et al. ............... 174/252 |
| 6,295,200 | B1 | * | 9/2001 | Schmidt ........................ 361/704 |

(Continued)

FOREIGN PATENT DOCUMENTS

| FR | 2 862 424 A1 | 5/2005 |
| JP | 10-041436 A | 2/1998 |
| JP | 2003-023223 A | 1/2003 |

OTHER PUBLICATIONS

Japanese Office Action in Application No. 2009-514861 mailed Jun. 26, 2012 (with English Translation).

*Primary Examiner* — Tuan T Dinh
*Assistant Examiner* — Steven Sawyer
(74) *Attorney, Agent, or Firm* — Oliff PLC

(57) ABSTRACT

This holder includes a conductor metal part designed to be warmed for assembly of the electrical component on the metal part. It also includes a part made of synthetic material, jointed with the metal part, guaranteeing cohesion of the holder. This part made out of synthetic material contains a mass with a low melting point and a mass with a high melting point, inserted between the mass with a low melting point and the metal part. More specifically, the mass with the high melting point is made in a material with a melting point greater than the melting point of the mass with a low melting point.

8 Claims, 1 Drawing Sheet

(56) References Cited

U.S. PATENT DOCUMENTS

| | | |
|---|---|---|
| 2001/0055202 A1* | 12/2001 | Templeton et al. ............ 361/761 |
| 2002/0105070 A1* | 8/2002 | Shibamoto et al. ........... 257/712 |
| 2002/0134569 A1* | 9/2002 | Farquhar et al. ............. 174/52.2 |
| 2003/0111260 A1* | 6/2003 | Fartash et al. ................. 174/260 |
| 2004/0201106 A1* | 10/2004 | Mercado et al. .............. 257/772 |
| 2005/0023677 A1* | 2/2005 | Zhao et al. .................... 257/734 |
| 2007/0147009 A1 | 6/2007 | Morelle et al. |

* cited by examiner

HOLDER FOR ELECTRICAL COMPONENT AND ELECTRICAL DEVICE INCLUDING THE HOLDER AND COMPONENT

This invention concerns a holder for electrical component and an electrical device including the holder and the electrical component.

It applies in particular to a holder on which an electrical component, for example a semi-conductor chip, is assembled by soldering with or without filler material.

A holder for electrical component including a conducting metal part intended to be heated to assemble the electrical component on the metal part, and a part made of synthetic material, jointed with the metal part guaranteeing the cohesion of the holder, comprising a mass with a low melting point are already known in the state of the art.

Generally, the mass with a low melting point is made, especially for economic reasons, of a material with little heat resistance, having a relatively low melting point, below 200° C.

In order to assemble the component by soldering, with or without filler material, the metal part must be heated near the component to a soldering temperature which may locally reach 300° C. for example.

Consequently, to protect the part made of synthetic material against an excessive temperature increase, a sufficient safety distance must be left between the part made of synthetic material and the component soldered on the metal part.

As a result, a relatively large part of the mass of the metal part is only useful during assembly of the component and increases the dimensions of the holder and of the electrical device including this holder.

The main purpose of the invention is to propose a holder for electrical component in which the dimensions of the metal part are relatively small, without there being a risk of damage to the part made of synthetic material during assembly of the component on the holder.

The invention therefore concerns a holder of the above-mentioned type, characterised in that the part made of synthetic material includes a mass with a high melting point, inserted between the mass with a low melting point and the metal part and made of a material whose melting point is greater than that of the mass with a low melting point.

Since the melting point of the mass with a high melting point is greater than that of the mass with a low melting point, it is possible to reduce or even eliminate the safety distance between the component and the part made of synthetic material. By reducing this distance, the dimensions of the electrical device can be reduced.

In addition, even if the material of the mass with a high melting point is more expensive than the material of the mass with a low melting point, reducing the total mass of the part made of synthetic material and the metal part offsets, at least partially, the additional cost of using a more expensive material.

A holder according to the invention may also include one or more of the following characteristics:
- the material of the mass with a high melting point is chosen from polyetheretherketone, high temperature polyetheretherketone and liquid crystal polymer;
- the material of the mass with a low melting point is chosen from phenylene polysulphide and polybrominated terphenyl;
- the mass with a high melting point is overmoulded on the metal part;
- the mass with a low melting point is overmoulded on the mass with a high melting point.

The invention also concerns an electrical device including a holder and an electrical component assembled on the holder, characterised in that the holder is a holder according to the invention.

An electrical device according to the invention may also include one or more of the following claims:
- the electrical component is soldered on the metal part of the holder with filler material;
- the electrical component is soldered on the metal part of the holder without filler material.

It will be easier to understand the invention on reading the description below, given as an example and referring to the attached drawings, on which:

FIG. 1 shows an electrical device according to the invention. The device is designated by the general reference 10.

Figure 1:
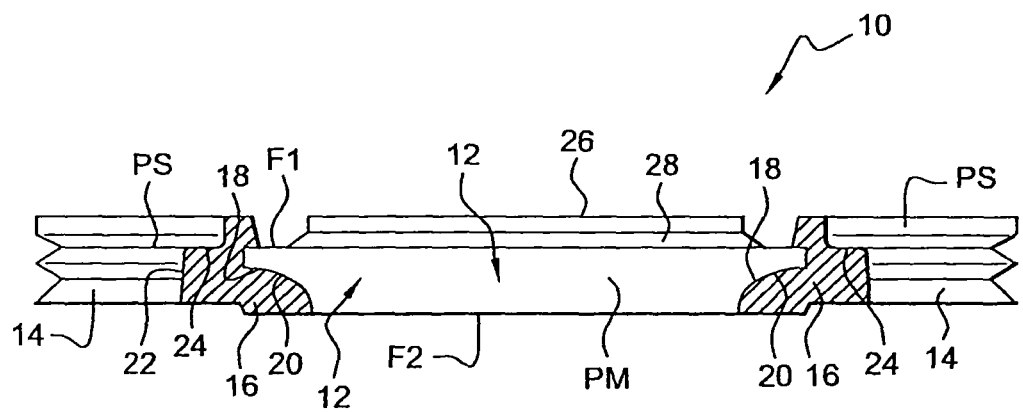
FIG. 1 is a cross-section of an electrical device according to the invention.

This device 10 includes a holder 12 whose general shape is that of a plate.

In particular, the holder 12 includes a conducting metal part PM and a part made of synthetic material PS, jointed with the metal part PM, guaranteeing the cohesion of the holder 12.

The metal part PM and the part made of synthetic material PS are bounded by opposite sides of the holder 12.

The material used to make the metal part PM may include, for example, copper or iron.

The part made of synthetic material PS includes a mass 14 with a low melting point. The melting point of the mass 14 is approximately, for example, 200° C.

The material of the mass with a low melting point 14 is, for example, chosen from phenylene polysulphide (PPS) and polybrominated terphenyl (PBT).

In addition, the part made of synthetic material (PS) also includes a mass 16 with a high melting point, inserted between the mass with a low melting point 14 and the metal part PM.

More specifically, the mass with a high melting point 16 is made of a material whose melting point is greater than that of the mass with a low melting point 14. For example, the melting point of the mass with a high melting point 16 is approximately 300° C.

Preferably, the mass with a high melting point 16 is made of a material chosen from polyetheretherketone (PEEK), high temperature polyetheretherketone (PEEK HT) and liquid crystal polymer (LCP).

The metal part PM is bounded by an edge 18 forming a junction with the part made of synthetic material PS, more especially with a first edge 20 of the mass with a high melting point 16.

The mass with a low melting point 14 is bounded by an edge 22 forming a junction with a second edge 24 of the mass with a high melting point 16.

The edges 18 and 20 forming junctions with the first and second edges 22 and 24 of the mass with a high melting point 16 extend between the opposite sides of the holder 12.

Advantageously, the mass with a high melting point 16 is overmoulded on the junction edge 18 of the metal part PM and the mass with a low melting point 14 is overmoulded on the edge 24 of the mass with a high melting point 16.

In the example described, the general shapes of the edges 18 and 20 and the edges 22 and 24 are complementary rebates.

The electrical device 10 also includes an electrical component 26, of type semi-conductor chip, for example, assembled on the first side F1 of the metal part PM.

In the example described, the component 26 is soldered on the metal part PM of the holder 12 with filler material. We therefore see on FIG. 1 that a mass 28 of solder is inserted between the component 26 and the first side F1 of the metal part PM.

The mass 28 of solder may possibly consist of a coating (not shown) of the first side F1 of the metal part PM, attached to the metal part PM with the solder, the coating material being nickel, for example.

Alternatively, the component 26 is soldered without filler material on the first side F1 of the metal part PM.

Figure 2:
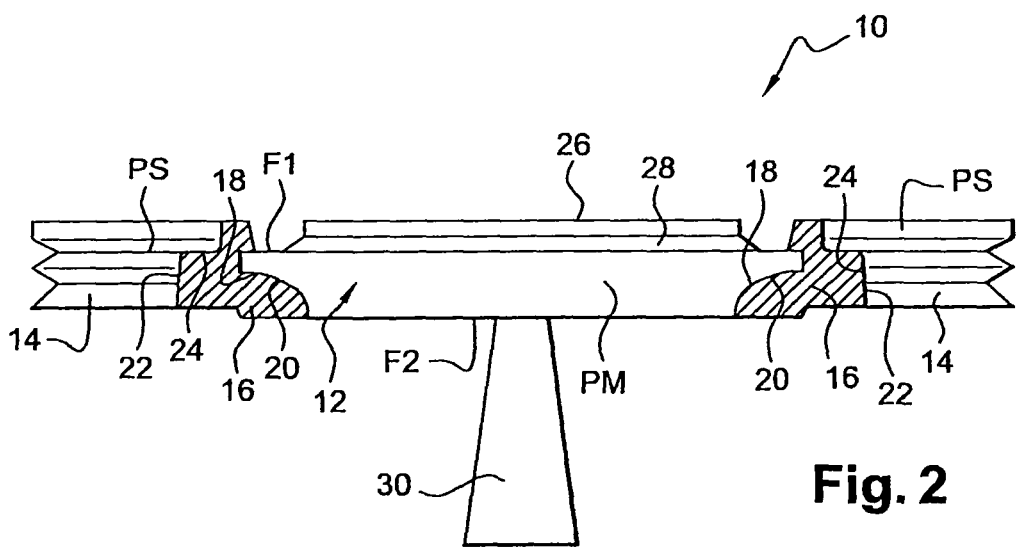
FIG. 2 is a cross-section of the device shown on FIG. 1, illustrating a step of assembly of an electrical component on a holder according to the invention.

FIG. 2 illustrates the step for soldering of the component 26 on the holder 12 according to a traditional soldering method.

Thus, in order to melt the mass 28 of solder, the metal part PM is heated near the component 26, for example by irradiation by a laser beam 30 of a second side F2 of the metal part PM opposite the first side F1.

Alternatively, the metal part PM is heated near the component 26 with a thermode or a micro-flame.

The heat then propagates in the metal part PM and reaches in particular the part made of synthetic material PS.

Since the part made of synthetic material PS includes a mass with a high melting point 16 inserted between the mass with a low melting point 14 and the metal part PM, there is no risk of damaging the mass with a low melting point 14 by an excessive temperature increase.

By making the mass with a high melting point 16 from a material whose melting point is greater than that of the mass 28 of solder, the safety distance planned between the mass with a high melting point 16 and the electrical component 26 can be reduced, thereby reducing the mass of the metal part PM.

According to the invention therefore, by reducing the mass of the metal part PM, it is possible to reduce the mass of the part made of synthetic material PS, and therefore the mass of the electrical device 10.

The invention claimed is:

1. A holder for an electrical component including:
   a conducting metal part, intended to be heated to assemble the electrical component on the metal part, and
   a part made of synthetic material, jointed with the metal part, guaranteeing the cohesion of the holder, including a mass with a low melting point, the part made of synthetic material including a mass with a high melting point, inserted between the mass with the low melting point and the metal part such that there is no contact between the mass with the low melting point and the metal part, and the mass with the high melting point being made of a material whose melting point is a temperature greater than that of the mass with the low melting point, thereby avoiding a risk of damaging the mass with the low melting point by an excessive temperature increase when the metal part is heated in order to assemble the component, wherein:
   the holder has a plate shape,
   the metal part is bounded by an edge forming a junction with a first edge of the mass with the high melting point,
   the mass with the low melting point is bounded by an edge forming a junction with a second edge of the mass with the high melting point, and
   the edges forming junctions with the first and second edges of the mass with the high melting point extend between opposite upper and lower sides of the holder.

2. The holder according to claim 1, wherein the material of the mass with the high melting point is chosen from polyetheretherketone, high temperature polyetheretherketone and liquid crystal polymer.

3. The holder according to claim 1, wherein the material of the mass with the low melting point is chosen from phenylene polysulphide and polybrominated terphenyl.

4. The holder according to claim 1, wherein the mass with the high melting point is overmoulded on the metal part.

5. The holder according to claim 4, wherein the mass with the low melting point is overmoulded on the mass with the high melting point.

6. An electrical device including:
   the holder according to claim 1 and the electrical component assembled on the holder.

7. The electrical device according to claim 6, wherein the electrical component is soldered on the metal part of the holder with filler material.

8. The electrical device according to claim 6, wherein the electrical component is soldered on the metal part of the holder without filler material.

* * * * *